US010331034B2

(12) United States Patent
Tanaka et al.

(10) Patent No.: US 10,331,034 B2
(45) Date of Patent: Jun. 25, 2019

(54) SUBSTRATE PROCESSING APPARATUS AND SUBSTRATE PROCESSING METHOD

(71) Applicant: SCREEN HOLDINGS CO., LTD., Kyoto (JP)

(72) Inventors: Yuji Tanaka, Kyoto (JP); Masaya Asai, Kyoto (JP); Masahiko Harumoto, Kyoto (JP); Koji Kaneyama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/737,805

(22) PCT Filed: Apr. 15, 2016

(86) PCT No.: PCT/JP2016/002054
§ 371 (c)(1),
(2) Date: Dec. 19, 2017

(87) PCT Pub. No.: WO2016/208103
PCT Pub. Date: Dec. 29, 2016

(65) Prior Publication Data
US 2019/0004427 A1 Jan. 3, 2019

(30) Foreign Application Priority Data

Jun. 22, 2015 (JP) ................................. 2015-124777

(51) Int. Cl.
*G03F 7/16* (2006.01)
*G03F 7/30* (2006.01)
*H01L 21/027* (2006.01)

(52) U.S. Cl.
CPC ................ *G03F 7/162* (2013.01); *G03F 7/16* (2013.01); *G03F 7/30* (2013.01); *H01L 21/027* (2013.01); *H01L 21/0276* (2013.01)

(58) Field of Classification Search
CPC ............. G03F 7/16; G03F 7/73; G03F 7/3092
(Continued)

(56) References Cited

U.S. PATENT DOCUMENTS

| 6,302,600 B1 | 10/2001 | Nagase et al. ................ 396/611 |
| 2001/0037858 A1 | 11/2001 | Taniyama et al. ............ 156/345 |

(Continued)

FOREIGN PATENT DOCUMENTS

| JP | 05-190442 A | 7/1993 |
| JP | 07-234524 A | 9/1995 |

(Continued)

OTHER PUBLICATIONS

International Search Report dated Jul. 12, 2016 in corresponding PCT International Application No. PCT/JP2016/002054.

(Continued)

*Primary Examiner* — Hung Nguyen
(74) *Attorney, Agent, or Firm* — Ostrolenk Faber LLP

(57) ABSTRACT

A substrate processing apparatus includes a spin chuck that holds a substrate, a processing liquid supply unit that supplies a first processing liquid having first specific gravity and a second processing liquid having second specific gravity smaller than the first specific gravity to a surface to be processed of the substrate held by the spin chuck, a collection tank that stores the used first and second processing liquids that have been supplied to the substrate, and a processing liquid separating mechanism that separates the first processing liquid and the second processing liquid based on specific gravity, the first and second processing liquids being stored in the collection tank.

9 Claims, 7 Drawing Sheets

(58) Field of Classification Search
    USPC .................................................... 355/27, 30
    See application file for complete search history.

(56) References Cited

U.S. PATENT DOCUMENTS

| | | | |
|---|---|---|---|
| 2005/0230348 A1 | 10/2005 | Kido | 216/58 |
| 2007/0184392 A1 | 8/2007 | Kyouda et al. | 430/331 |
| 2008/0015278 A1 | 1/2008 | Malik et al. | 522/150 |
| 2008/0045682 A1 | 2/2008 | Schwab | 526/241 |
| 2009/0004876 A1* | 1/2009 | Koyata | H01L 21/02019 438/753 |
| 2009/0087566 A1 | 4/2009 | Kimura | 427/299 |
| 2009/0158613 A1 | 6/2009 | Aihara | 34/341 |
| 2009/0242517 A1 | 10/2009 | Fujiwara et al. | 216/92 |
| 2010/0021703 A1 | 1/2010 | Terai et al. | 428/195.1 |
| 2010/0327218 A1 | 12/2010 | Kido | 252/79.1 |
| 2011/0092653 A1 | 4/2011 | Schwab | 525/370 |
| 2011/0184139 A1 | 7/2011 | Malik et al. | 526/240 |
| 2012/0315451 A1 | 12/2012 | Malik et al. | 428/209 |
| 2014/0038423 A1 | 2/2014 | Iwao et al. | 438/758 |
| 2014/0071411 A1 | 3/2014 | Takiguchi et al. | 355/27 |
| 2014/0109430 A1 | 4/2014 | Aihara | 34/201 |
| 2016/0202609 A1 | 7/2016 | Takiguchi et al. | |

FOREIGN PATENT DOCUMENTS

| | | | |
|---|---|---|---|
| JP | 11-016825 A | 1/1999 | |
| JP | 2000-199953 A | 7/2000 | |
| JP | 2000-228386 A | 8/2000 | |
| JP | 2000-286224 A | 10/2000 | |
| JP | 2000-338684 A | 12/2000 | |
| JP | 2001-319910 A | 11/2001 | |
| JP | 2002-134458 A | 5/2002 | |
| JP | 2003-178944 A | 6/2003 | |
| JP | 2005-303151 A | 10/2005 | |
| JP | 2007-208086 A | 8/2007 | |
| JP | 2010-034485 A | 2/2010 | |
| JP | 2011-530652 A | 12/2011 | |
| JP | 2012-174768 A | 9/2012 | |
| JP | 2014-075575 A | 4/2014 | |
| JP | 2015-028987 A | 2/2015 | |
| TW | 200926275 A | 6/2009 | |
| TW | 201421536 A | 6/2014 | |
| WO | WO 2016/194285 A1 | 12/2016 | |

OTHER PUBLICATIONS

Written Opinion dated Jul. 12, 2016 in corresponding PCT International Application No. PCT/JP2016/002054.
Office Action and Search Report dated Feb. 20, 2017 in corresponding Taiwan Patent Application No. 105116502.
Related U.S. Appl. No. 15/579,505, filed Dec. 4, 2017; (see also WO 2016/194285 A1).
Office Action dated Nov. 22, 2017 issued in counterpart Taiwanese Patent Application No. 105116503.
Notice of Reasons for Refusal dated Nov. 6, 2018 in counterpart Japanese Patent Application No. 2015-124777.
Notice of Reasons for Refusal dated Jan. 15, 2019 in counterpart Japanese Patent Application No. 2015-124777.

* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2016/002054, filed Apr. 15, 2016, which claims priority to Japanese Patent Application No. 2015-124777, filed Jun. 22, 2015, the contents of both of which are incorporated herein by reference. The PCT International Application was published in the Japanese language.

TECHNICAL FIELD

The present invention relates to a substrate processing apparatus and a substrate processing method for performing substrate processing with use of a processing liquid.

BACKGROUND ART

In a lithography process in the manufacture of a semiconductor device and the like, a resist liquid is supplied onto a substrate, so that a resist film is formed. The resist film is exposed, and then a development liquid is supplied to the resist film. Therefore, the resist film is formed to have a predetermined pattern (see Patent Document 1, for example).

A development processing apparatus described in Patent Document 1 includes a spin chuck, a movable cup and two development liquid supply nozzles. The spin chuck rotatably holds a wafer on which various types of resist films are formed. The movable cup surrounds the spin chuck and is arranged to be movable in an up-and-down direction. The two development liquid supply nozzles are arranged above the wafer.

In the case where the resist film on the wafer is a positive type, the movable cup is lifted, and a positive-type development liquid is supplied to the wafer from one development liquid supply nozzle. The positive-type development liquid supplied to the wafer is discharged from one discharge port of the movable cup. In the case where the resist film on the wafer is a negative type, the movable cup is lowered, and a negative-type development liquid is supplied to the wafer from the other development liquid supply nozzle. The negative-type development liquid supplied to the wafer is discharged from another discharge port of the movable cup.

[Patent Document ]1JP 2014-75575 A

SUMMARY OF INVENTION

Technical Problem

It is described in Patent Document 1 that the above-mentioned configuration enables the development liquids to be discharged without mixing of the positive-type development liquid and the negative-type development liquid. However, part of discharge flow paths is commonly used for the positive-type development liquid and the negative-type development liquid, so that the positive-type development liquid and the negative-type development liquid are subtly mixed. Therefore, the positive-type development liquid and the negative-type development liquid cannot be separately collected.

An object of the present invention is to provide a substrate processing apparatus capable of separately collecting different types of processing liquids and a substrate processing method by which the different types of the processing liquids can be separately collected.

Solution to Problem (1) A substrate processing apparatus according to one aspect of the present invention includes a substrate holder that holds a substrate, a processing liquid supply unit that supplies a first processing liquid having first specific gravity and a second processing liquid having second specific gravity smaller than the first specific gravity to a surface to be processed of the substrate held by the substrate holder, a storage that stores the used first and second processing liquids that have been supplied to the substrate, and a processing liquid separating mechanism that separates the first processing liquid and the second processing liquid based on specific gravity, the first and second processing liquids being stored in the storage.

In this substrate processing apparatus, the substrate is held by the substrate holder. In this state, the first and second processing liquids are supplied to the surface to be processed of the substrate by the processing liquid supply unit. The used first and second processing liquids that have been supplied to the substrate are stored in the storage. Here, the specific gravity of the second processing liquid is smaller than the specific gravity of the first processing liquid, so that a layer of the first processing liquid and a layer of the second processing liquid are formed to be separated into upper and lower layers in the storage. Thus, the first processing liquid and the second processing liquid can be separated based on specific gravity.

In this configuration, even in the case where being discharged through a common discharge flow path, the used first and second processing liquids can be separated in the storage. As a result, the first and second processing liquids can be separately collected. Further, different types of processing liquids are separately collected, so that the cost of discarding the processing liquids can be reduced.

(2) The processing liquid separating mechanism may include a first discharge pipe provided to discharge the used first processing liquid from the storage, a second discharge pipe provided to discharge the used second processing liquid from the storage, a first discharge valve inserted into the first discharge pipe, a boundary surface detector that detects a boundary surface between the first processing liquid and the second processing liquid that are stored in the storage, and a controller that acquires the boundary surface detected by the boundary surface detector, controls the first discharge valve such that, in the case where the acquired detection surface is equal to or lower than a predetermined lower limit position, the first discharge valve is closed, and controls the first discharge valve such that, in the case where the acquired detection surface is higher than the lower limit position, the first discharge valve is opened, and the first discharge pipe is connected to the storage at a position lower than the lower limit position, and the second discharge pipe is connected to the storage at a position higher than the lower limit position.

In this case, the used first processing liquid can be collected from the storage through the first discharge pipe with the simple control, and the used second processing liquid can be collected from the storage through the second discharge pipe with the simple control. Further, it is not necessary for a user to perform an operation of separating the first processing liquid and the second processing liquid. Thus, the cost of discarding the processing liquids can be reduced.

(3) The processing liquid separating mechanism may further include a second discharge valve inserted into the second discharge pipe, and the controller, in the case where the acquired detection surface is equal to or lower than an upper limit position, which has been determined in advance and is higher than the lower limit position, may open the second discharge valve, and in the case where the acquired detection surface is higher than the upper limit position, may close the second discharge valve.

In this case, collection of the used first processing liquid from the storage through the second discharge pipe can be prevented with a simple configuration.

(4) The first processing liquid may include an aqueous solution, and the second processing liquid may include an organic solvent. In this case, the substrate processing with use of the processing liquid including the aqueous solution and the processing liquid including the organic solvent can be performed in a common part of the substrate processing apparatus. Further, the processing liquid including the aqueous solution and the processing liquid including the organic solvent can be separately collected.

(5) The substrate processing apparatus may further include a coating liquid supply unit configured to discharge a coating liquid containing metal as a metal containing coating liquid, wherein the substrate holder may be configured to hold and rotate the substrate in a horizontal attitude, the first processing liquid may dissolve the metal in the metal containing coating liquid, the second processing liquid may dissolve the coating liquid in the metal containing coating liquid, the coating liquid supply unit may form a metal containing coating film on the surface to be processed of the substrate by discharging the metal containing coating liquid to the surface to be processed of the substrate rotated by the substrate holder, and the processing liquid supply unit may supply the first and second processing liquids to a peripheral portion of the surface to be processed of the substrate rotated by the substrate holder such that the metal containing coating film remains in a region except for the peripheral portion of the surface to be processed of the substrate.

In this case, the metal containing coating film is formed on the surface to be processed of the substrate except for the peripheral portion. Thus, a finer pattern can be formed with use of the metal containing coating film. Further, a metal component and the coating liquid in the peripheral portion of the substrate are dissolved by the first and second processing liquids, respectively. Thus, contamination of the substrate processing apparatus due to particles caused by a remaining coating film in the peripheral portion of the substrate can be prevented. Contamination of the substrate processing apparatus due to remaining metal in the peripheral portion of the substrate can be prevented.

Further, the first processing liquid and the second processing liquid are separated based on the specific gravity, so that the first and second processing liquids can be separately collected. Thus, the cost of discarding the first and second processing liquids can be reduced.

(6) The substrate processing apparatus may further include a back surface processing unit that supplies the first and second processing liquids to a back surface, which is opposite to the surface to be processed, of the substrate rotated by the substrate holder.

In this configuration, even in the case where the metal containing coating liquid has flowed to the back surface of the substrate, the metal containing coating liquid adhering to the back surface of the substrate is removed by the back surface processing unit. Thus, contamination of the substrate processing apparatus can be sufficiently prevented.

(7) The substrate holder may selectively hold a substrate having a surface to be processed on which positive-tone development processing is to be performed, and a substrate having a surface to be processed on which negative-tone development processing is to be performed, the first processing liquid may be a development liquid for positive-tone development, the second processing liquid may be a development liquid for negative-tone development, and the processing liquid supply unit, when the substrate having the surface to be processed on which the positive-tone development processing is to be performed is held by the substrate holder, may discharge the first processing liquid, and when the substrate having the surface to be processed on which the negative-tone development processing is to be performed is held by the substrate holder, may discharge the second processing liquid.

In this case, when the substrate having the surface to be processed on which the positive-tone development processing is to be performed is held by the substrate holder, the first processing liquid is discharged from the processing liquid supply unit, so that positive-tone development can be performed on the surface to be processed of the substrate. On the other hand, when the substrate having the surface to be processed on which the negative-tone development processing is to be performed is held by the substrate holder, the second processing liquid is discharged from the processing liquid supply unit, so that the negative-tone development can be performed on the surface to be processed of the substrate.

(8) A substrate processing method according to another aspect of the present invention includes the steps of holding a substrate by a substrate holder, supplying a first processing liquid having first specific gravity and a second processing liquid having second specific gravity smaller than the first specific gravity by a processing liquid supply unit to a surface to be processed of the substrate held by the substrate holder, storing the used first and second processing liquids that have been supplied to the substrate by the processing liquid supply unit in a storage and separating the first processing liquid and the second processing liquid based on specific gravity, the first and second processing liquids being stored in the storage.

In this substrate processing method, the substrate is held by the substrate holder. In this state, the first and second processing liquids are supplied to the surface to be processed of the substrate by the processing liquid supply unit. The used first and second processing liquids that have been supplied to the substrate are stored in the storage. Here, the specific gravity of the second processing liquid is smaller than the specific gravity of the first processing liquid, so that the layer of the first processing liquid and the layer of the second processing liquid are formed to be separated into upper and lower layers in the storage. Thus, the first processing liquid and the second processing liquid can be separated based on the specific gravity.

With this method, even in the case where being discharged through the common discharge flow path, the used first and second processing liquids can be separated in the storage. As a result, the first and second processing liquids can be separately collected. Further, different types of processing liquids are separately collected, so that the cost of discarding the processing liquids can be reduced.

Advantageous Effects of Invention

The present invention enables different types of processing liquids to be separately collected.

DESCRIPTION OF EMBODIMENTS

A substrate processing apparatus and a substrate processing method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, as for the substrate used in the present embodiment, at least part of the substrate has a circular outer periphery. The outer periphery except for a notch for positioning is circular, for example.

(1) Substrate Processing Apparatus

Figure 1:
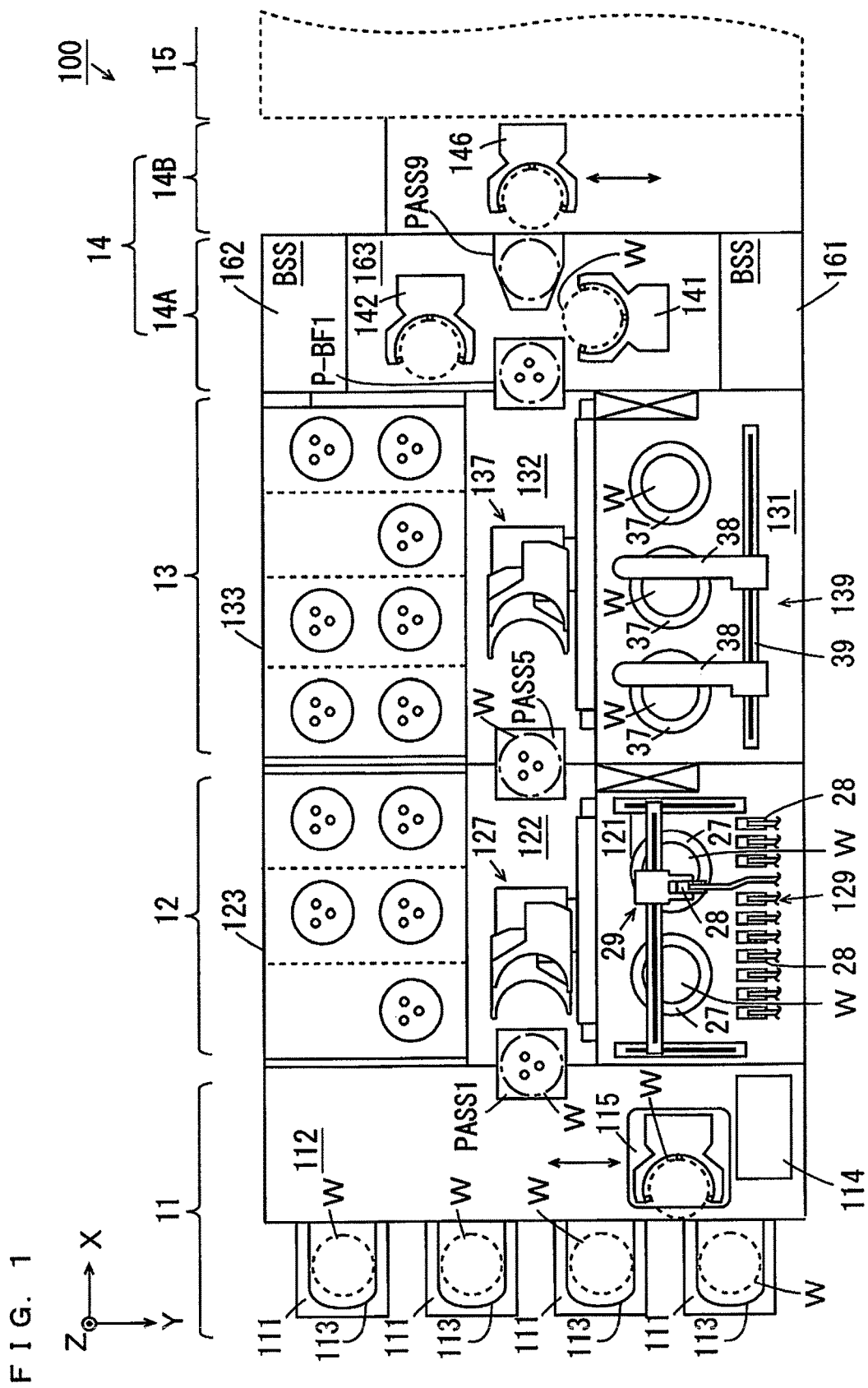
FIG. 1 is a schematic plan view of a substrate processing apparatus according to one embodiment of the present invention.

FIG. 1 is a schematic plan view of the substrate processing apparatus according to one embodiment of the present invention. FIG. 1 and the subsequent drawings are accompanied by arrows that indicate X, Y and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B.

As shown in FIG. 1, the indexer block 11 includes a plurality of carrier platforms 111 and a transport section 112. In each carrier platform 111, a carrier 113 for storing a plurality of substrates W in multiple stages is placed. In the transport section 112, a main controller 114 and a transport mechanism 115 are provided. The main controller 114 controls various constituent elements of the substrate processing apparatus 100. The transport mechanism 115 holds and transports the substrate W.

The first processing block 12 includes a coating processing section 121, a transport section 122 and a thermal processing section 123. The coating processing section 121 and the thermal processing section 123 are provided to be opposite to each other with the transport section 122 interposed therebetween. Substrate platforms PASS1 to PASS4 (see FIG. 7) on which the substrates W are placed are provided between the transport section 122 and the indexer block 11. Transport mechanisms 127, 128 (see FIG. 7) for transporting the substrates W are provided in the transport section 122.

The second processing block 13 includes a development processing section 131, a transport section 132 and a thermal processing section 133. The development processing section 131 and the thermal processing section 133 are provided to be opposite to each other with the transport section 132 interposed therebetween. Substrate platforms PASS5 to PASS8 (see FIG. 7) on which the substrates W are placed are provided between the transport section 132 and the transport section 122. Transport mechanisms 137, 138 (see FIG. 7) for transporting the substrates W are provided in the transport section 132.

The cleaning drying processing block 14A includes cleaning drying processing sections 161, 162 and a transport section 163. The cleaning drying processing sections 161, 162 are provided to be opposite to each other with the transport section 163 interposed therebetween. Transport mechanisms 141, 142 are provided in the transport section 163. Placement buffer units P-BF1, P-BF2 (see FIG. 7) are provided between the transport section 163 and the transport section 132. The placement buffer units P-BF1, P-BF2 are configured to be able to store the plurality of substrates W.

Further, a substrate platform PASS9 and below-mentioned placement cooling units P-CP (see FIG. 7) are provided to be adjacent to the carry-in carry-out block 14B between the transport mechanisms 141, 142. The placement cooling units P-CP include a function of cooling the substrates W (cooling plates, for example). In the placement cooling units P-CP, the substrates W are cooled to a temperature suitable for the exposure processing. A transport mechanism 146 is provided in the carry-in carry-out block 14B. The transport mechanism 146 carries in the substrate W to and carries out the substrate W from the exposure device 15.

Figure 2:
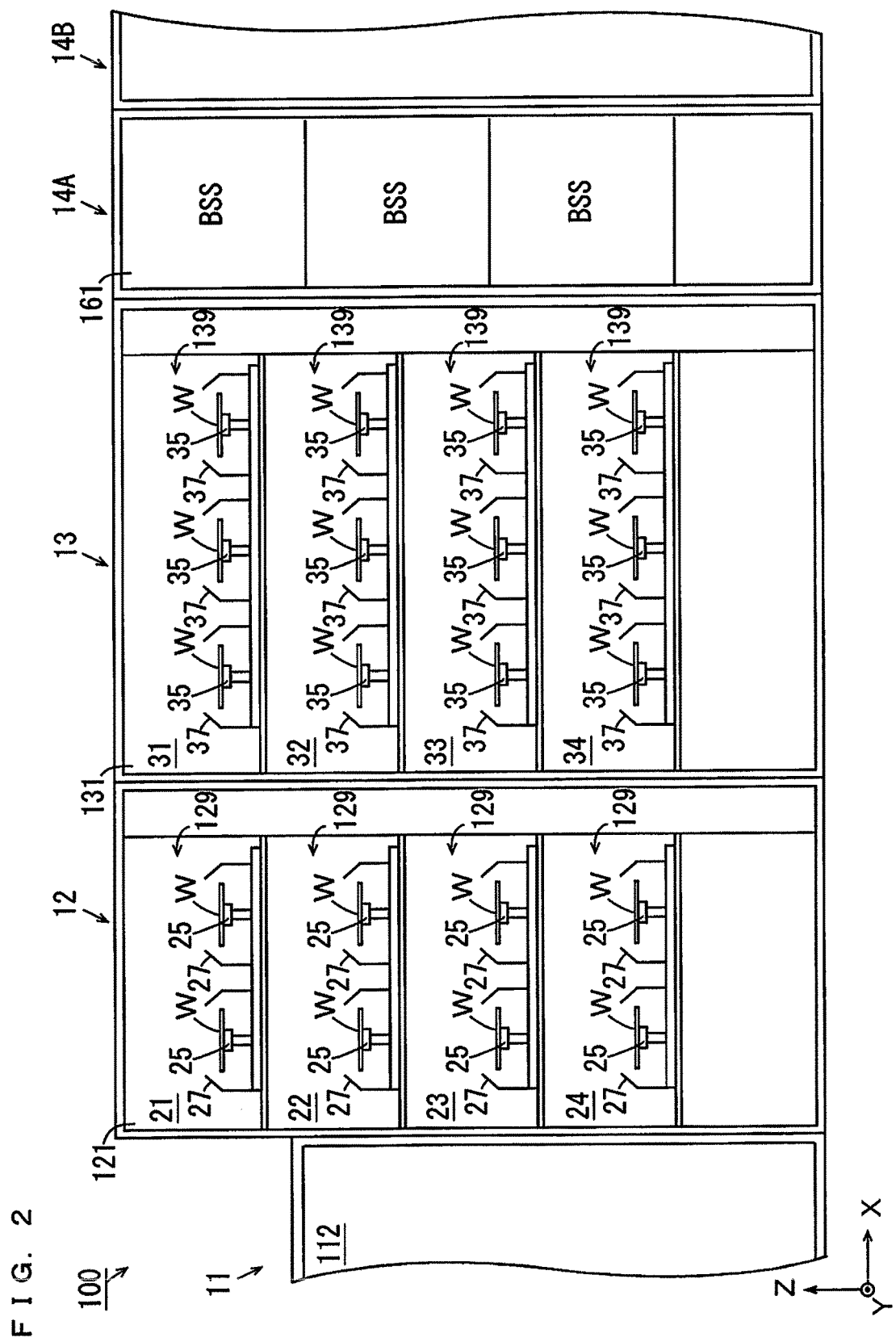
FIG. 2 is a schematic side view showing inner configurations of a coating processing section, a development processing section and a cleaning drying processing section of FIG. 1.

(2) Coating Processing Section, Development Processing Section and Cleaning Drying Processing Section FIG. 2 is a schematic side view showing inner configurations of the coating processing section 121, the development processing section 131 and the cleaning drying processing section 161 of FIG. 1. As shown in FIG. 2, the coating processing section 121 has coating processing chambers 21, 22, 23, 24 provided in a stack. Each of the coating processing chambers 21, 22, 23, 24 is provided with a coating processing unit 129. The development processing section 131 has development processing chambers 31, 32, 33, 34 provided in a stack. Each of the development processing chambers 31, 32, 33, 34 is provided with a development processing unit 139.

Figure 3:
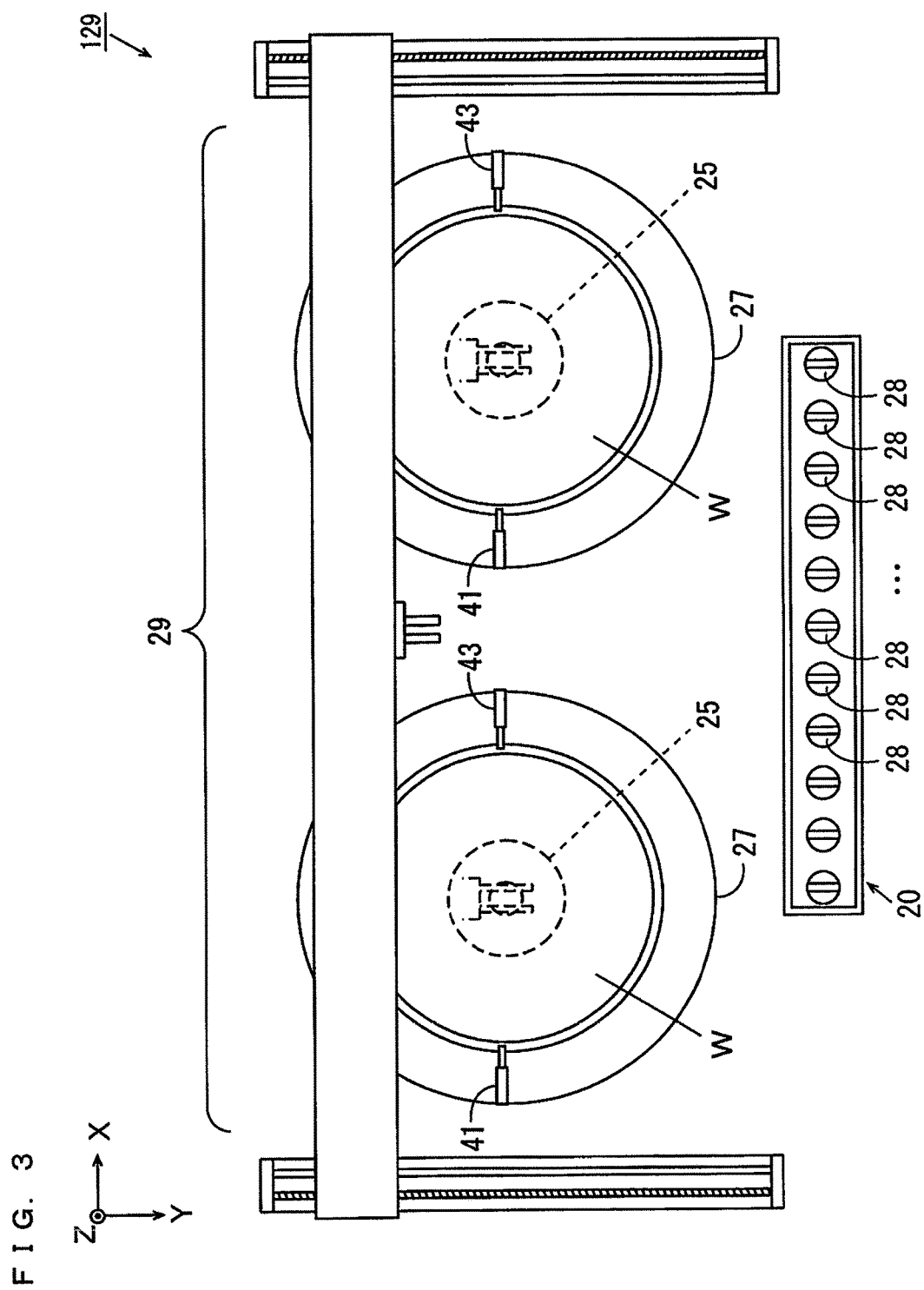
FIG. 3 is a schematic plan view showing a configuration of a coating processing unit.
Figure 4:
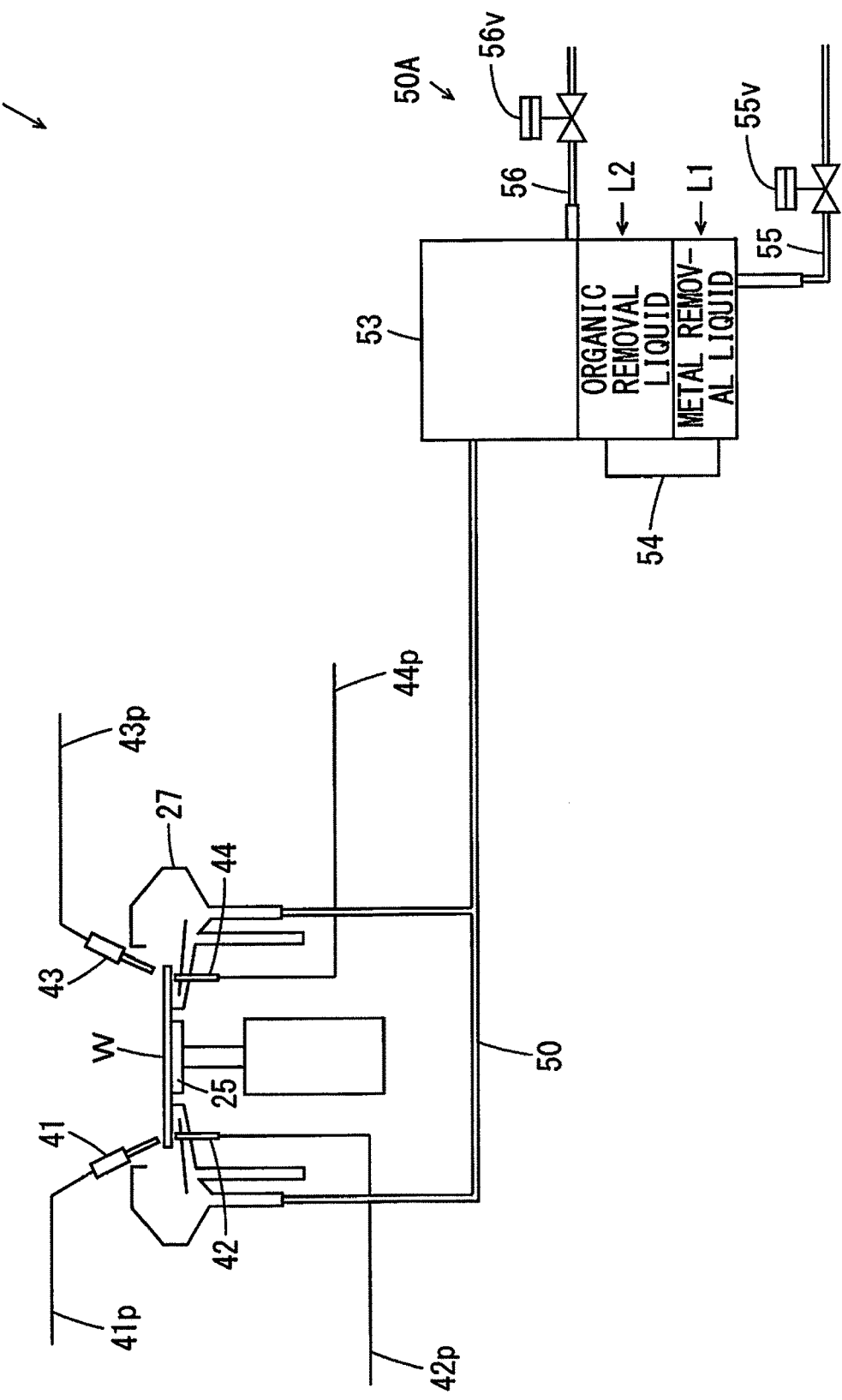
FIG. 4 is a schematic side view showing the configuration of the coating processing unit.

FIG. 3 is a schematic plan view showing a configuration of the coating processing unit 129. FIG. 4 is a schematic side view showing a configuration of the coating processing unit 129. As shown in FIGS. 3 and 4, each coating processing unit 129 includes a waiting section 20, a plurality of spin chucks 25, a plurality of cups 27, a plurality of coating liquid nozzles 28, a nozzle transport mechanism 29, a plurality of edge rinse nozzles 41, 43 and a plurality of back rinse nozzles 42, 44. In the present embodiment, two spin chucks 25, two cups 27, two edge rinse nozzles 41, two edge rinse nozzles 43, two back rinse nozzles 42 and two back rinse nozzles 44 are provided in each coating processing unit 129.

As shown in FIG. 3, each spin chuck 25 is driven to be rotated by a driving device (not shown) (an electric motor, for example) while holding the substrate W. Each cup 27 is provided to surround the spin chuck 25. During the wait, each coating liquid nozzle 28 is inserted into the waiting section 20. Various types of coating liquids are supplied to each coating liquid nozzle 28 from a coating liquid storage (not shown) through a coating liquid pipe. Any one of the plurality of coating liquid nozzles 28 is moved to a position above the substrate W by the nozzle transport mechanism 29. The coating liquid is discharged from the coating liquid nozzle 28 while the spin chuck 25 is rotated. Thus, the coating liquid is applied onto the rotating substrate W.

In the present embodiment, a coating liquid (an anti-reflection liquid) for an anti-reflection film is discharged from the coating liquid nozzles 28 of the coating processing chambers 22, 24 of FIG. 2. A coating liquid (a resist liquid) for a resist film is discharged from the coating liquid nozzles 28 of the coating processing chambers 21, 23.

A metallic component such as metallic molecules or metallic oxide for forming finer patterns is contained in the anti-reflection liquid and the resist liquid as a composition. In the present example, Sn (tin), $HfO_2$ (hafnium oxide) or $ZrO_2$ (zirconium dioxide), for example, is contained in the anti-reflection liquid and the resist liquid as a metallic component. Hereinafter, the coating liquid such as the anti-reflection liquid containing a metallic component or the resist liquid containing a metallic component is collectively termed as a metal containing coating liquid. Further, a film formed of the metal containing coating liquid is referred to as a metal containing coating film.

As shown in FIG. 4, the edge rinse nozzles 41, 43 are arranged to be directed to peripheral portions of surfaces to be processed of the substrates W held by the spin chucks 25. Here, the surface to be processed refers to a surface of the substrate W on which each type of a pattern such as a circuit pattern is formed. The peripheral portion of the substrate W refers to a region, having a constant width and extending along an outer periphery of the substrate W, of the surface to be processed of the substrate W. The back rinse nozzles 42, 44 are arranged to be directed to the back surfaces of the substrates W held by the spin chucks 25. Here, the back surface refers to a surface that is opposite to the surface to be processed of the substrate W.

Supply pipes 41p, 43p are connected to the edge rinse nozzles 41, 43, respectively. Supply pipes 42p, 44p are connected to the back rinse nozzles 42, 44, respectively. A removal liquid is supplied to the respective edge rinse nozzle 41 and back rinse nozzle 42 from a first removal liquid supply tank (not shown) through the respective supply pipes 41p, 42p. A removal liquid is supplied to the respective edge rinse nozzle 43 and back rinse nozzle 44 from a second removal liquid supply tank (not shown) through the respective supply pipes 43p, 44p.

Here, an organic solvent is stored in the first removal liquid supply tank as the removal liquid. The organic solvent includes thinner, for example. An alkaline removal liquid or an acid removal liquid is stored in the second removal liquid supply tank. The alkaline removal liquid is an aqueous solution including ammonia and hydrogen peroxide, for example. The acid removal liquid is an aqueous solution including diluted hydrofluoric acid, for example. The acid removal liquid may be an aqueous solution including sulfuric acid and hydrogen peroxide, for example.

Hereinafter, the removal liquid including the organic solvent discharged from the edge rinse nozzle 41 and the back rinse nozzle 42 is referred to as an organic removal liquid. The alkaline removal liquid or the acid removal liquid discharged from the edge rinse nozzle 43 and the back rinse nozzle 44 is referred to as a metal removal liquid. The metal removal liquid can dissolve a metal component contained in the anti-reflection liquid or the resist liquid.

In the coating processing unit 129, two second supply tanks in which different types of metal removal liquids are respectively stored may be provided. In this case, different types of metal removal liquids can be respectively discharged from the two edge rinse nozzles 43 of each coating processing unit 129. Similarly, different types of metal removal liquids can be respectively discharged from the two back rinse nozzles 44 of each coating processing unit 129. The metal removal liquids may be discharged from the edge rinse nozzle 43 and the back rinse nozzle 44 with their temperatures adjusted to 30° C. to 40° C., for example.

With the substrate W rotated by the spin chuck 25, the organic removal liquid is discharged to the peripheral portion of the substrate W from the edge rinse nozzle 41, and the organic removal liquid is discharged to the back surface of the substrate W from the back rinse nozzle 42. In this case, the coating liquid that has been applied to the peripheral portion and the back surface of the substrate W is dissolved. Thus, the coating liquid in the peripheral portion and the back surface of the substrate W can be removed, and the substrate processing apparatus 100 can be prevented from being contaminated by particles.

However, a metal component contained in the metal containing coating liquid remains in the peripheral portion of the substrate W. Further, in the case where the metal containing coating liquid has flowed to the back surface of the substrate W, the metal component contained in the metal containing coating liquid remains on the back surface of the substrate W.

When the substrate W is transported in the substrate processing apparatus 100 with the metal component adhering to the peripheral portion or the back surface of the substrate W, contamination by the metal component occurs not only in each transport mechanism and each processing unit in the substrate processing apparatus 100, but also in the exposure device 15. Then, with the substrate W rotated by the spin chuck 25, the metal removal liquid is discharged to the peripheral portion of the substrate W from the edge rinse nozzle 43, and the metal removal liquid is discharged to the back surface of the substrate W from the back rinse nozzle 44. In this case, the metal component remaining in the peripheral portion and the back surface of the substrate W is dissolved. Thus, the metal component remaining in the peripheral portion and the back surface of the substrate W is removed.

As shown in FIG. 2, the development processing unit 139 includes a plurality of spin chucks 35 and a plurality of cups 37 similarly to the coating processing unit 129. Further, as shown in FIG. 1, the development processing unit 139 includes two slit nozzles 38 for discharging the development liquid and a movement mechanism 39 for moving these slit nozzles 38 in the X direction.

In the development processing unit 139, the spin chuck 35 is rotated by a driving device (not shown). Thus, the substrate W is rotated. In this state, the slit nozzle 38 supplies the development liquid to each substrate W while moving. Thus, the development processing for the substrate W is performed.

A plurality (three in the present example) of cleaning drying processing units BSS are provided in the cleaning drying processing section 161. In each cleaning drying processing unit BSS, the peripheral portion and the back surface of the substrate W on which the exposure processing has not been performed are cleaned with use of an organic solvent or pure water and dried.

(3) Removal Liquid Collection Processing

As described above, the organic removal liquid and the metal removal liquid are used in the substrate processing of the coating processing unit 129. Therefore, it is preferable that the used organic removal liquid and the used metal removal liquid are separately collected from the cup 27. As such, as shown in FIG. 4, a collection pipe 50 is connected to a liquid drain of the cup 27. Further, the collection pipe 50 is connected to a collection tank 53 at the downstream of the collection pipe 50. In this case, the used organic removal liquid and the used metal removal liquid from the cup 27 are led to the common collection tank 53.

Here, the organic removal liquid has specific gravity different from specific gravity of the metal removal liquid, and the specific gravity of the metal removal liquid is larger than the specific gravity of the organic removal liquid. Therefore, a layer of the metal removal liquid and a layer of the organic removal liquid are formed to be separated into upper and lower layers in the collection tank 53. Thus, a boundary detector 54 for detecting a boundary surface between the metal removal liquid and the organic removal liquid is provided in the collection tank 53. While the boundary detector 54 is a capacitance-type liquid surface level sensor in the present embodiment, the present invention is not limited to this. The boundary detector 54 may be a liquid surface level sensor of another type such as a float type, an optical type, an ultrasonic type, an electrical conductivity type or a piezo resonance type.

In the collection tank 53, a lower limit level L1 and an upper limit level L2 for a boundary surface between the metal removal liquid and the organic removal liquid are set. The upper limit level L2 is positioned higher than the lower limit level L1. In the collection tank 53, a collection pipe 55 is attached to a position lower than the lower limit level L1, and a collection pipe 56 is attached to a position higher than the upper limit level L2. The collection pipes 55, 56 are connected to a metal removal liquid collector and an organic removal liquid collector (not shown), respectively. Collection valves 55v, 56v are inserted into the collection pipes 55, 56, respectively.

Figure 5:
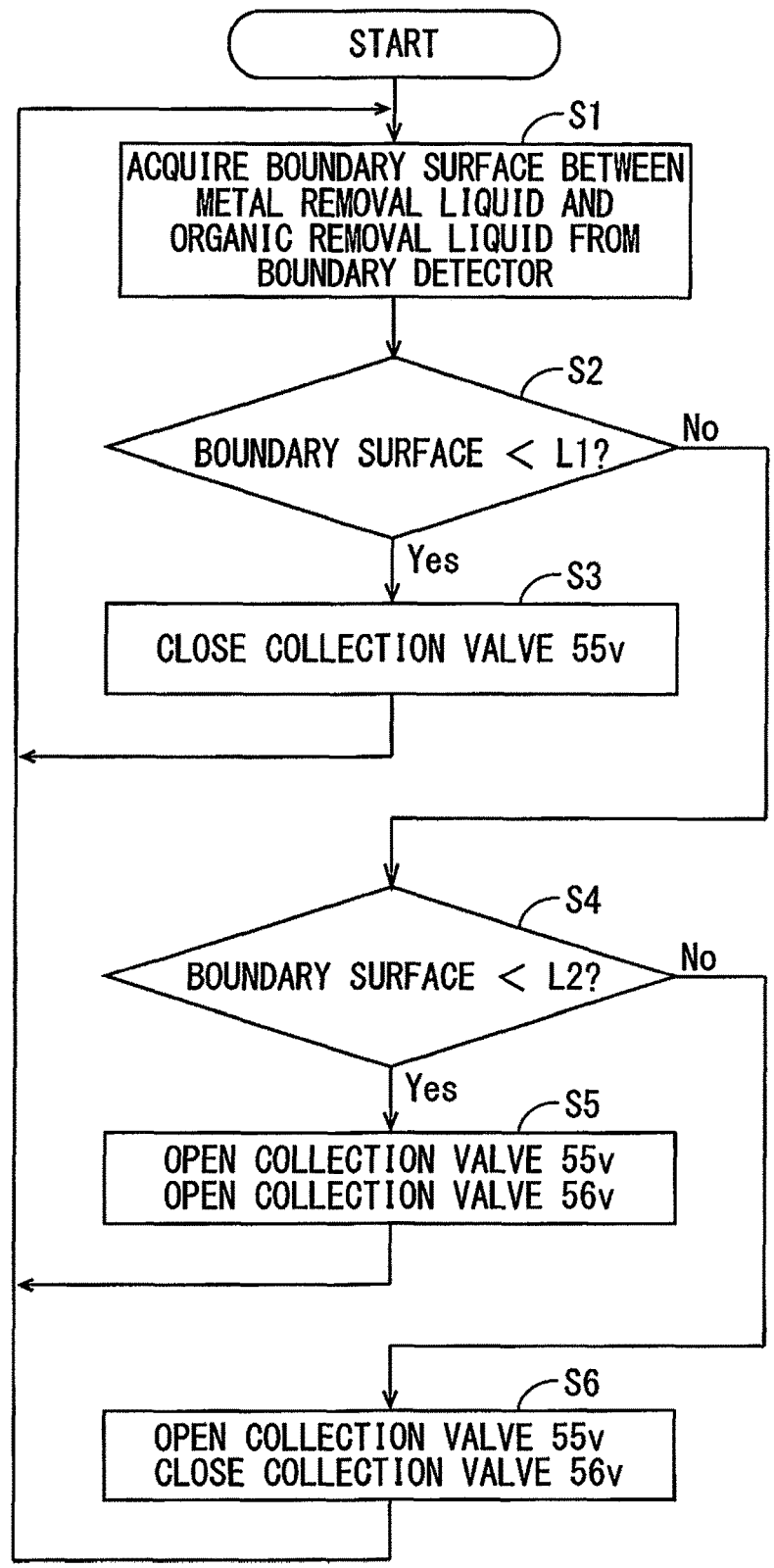
FIG. 5 is a flow chart showing control of collection valves.

A processing liquid separating mechanism 50A is constituted by the boundary detector 54, the collection pipes 55, 56, the collection valves 55v, 56v and a local controller LC1, described below, of FIG. 6. The processing liquid separating mechanism 50A separately collects different types of processing liquids. FIG. 5 is a flow chart showing the control of the collection valves 55v, 56v. The operations of the collection valves 55v, 56v are controlled by the local controller LC1.

As shown in FIG. 5, the local controller LC1 acquires a boundary surface between the metal removal liquid and the organic removal liquid in the collection tank 53 from the boundary detector 54 (step S1). Next, the local controller LC1 determines whether the acquired level of the boundary surface is lower than the lower limit level L1 (step S2).

In the case where the level of the boundary surface is lower than the lower limit level L1 in the step S2, the local controller LC1 closes the collection valve 55v (step S3). Thereafter, the local controller LC1 returns to the process of the step S1. At a time point of the step S3, the collection valve 56v may be opened or closed. On the other hand, in the case where the level of the boundary surface is equal to or higher than the lower limit level L1 in the step S2, the local controller LC1 determines whether the level of the boundary surface is lower than the upper limit level L2 (step S4).

In the case where the level of the boundary surface is lower than the upper limit level L2 in the step S4, the local controller LC1 opens the collection valve 55v and opens the collection valve 56v (step S5). Thereafter, the local controller LC1 returns to the process of the step S1. On the other hand, in the case where the level of the boundary surface is equal to or higher than the upper limit level L2 in the step S4, the local controller LC1 opens the collection valve 55v and closes the collection valve 56v (step S6). Thereafter, the local controller LC1 returns to the process of the step S1.

In this process, in the case where the level of the boundary surface is lower than the lower limit level L1, the collection valve 55v is closed. Thus, the organic removal liquid is prevented from being discharged from the collection pipe 55. In the case where the level of the boundary surface is equal to or higher than the lower limit level L1 and lower than the upper limit level L2, the collection valves 55v, 56v are opened. Thus, the metal removal liquid and the organic removal liquid are discharged from the collection pipes 55, 56, respectively. In the case where the level of the boundary surface is equal to or higher than the upper limit level L2, the collection valve 56v is closed. Thus, the metal removal liquid is prevented from being discharged from the collection pipe 56.

In this manner, in the method of collecting the removal liquids in the present embodiment, the used organic removal liquid and the used metal removal liquid are separated based on the specific gravity of the organic removal liquid and the specific gravity of the metal removal liquid. In this collection method, the organic removal liquid and the metal removal liquid can be separately collected. In this case, it is not necessary for the user to perform an operation of separating the organic removal liquid from the metal removal liquid. Thus, the cost of discarding the removal liquids can be reduced.

While the collection valve 56v is inserted into the collection pipe 56 in the above-mentioned method of collecting the removal liquids, the present invention is not limited to this. In the case where the collection pipe 56 is attached to a position sufficiently higher than the upper limit level L2, and is configured such that the metal removal liquid is not discharged from the collection pipe 56, the collection valve 56v does not have to be inserted into the collection pipe 56. In this case, the process of the steps S4, S6 of FIG. 5 is not performed, and only the collection valve 55v is opened in the process of the step S5.

(4) Thermal Processing Sections

Figure 6:
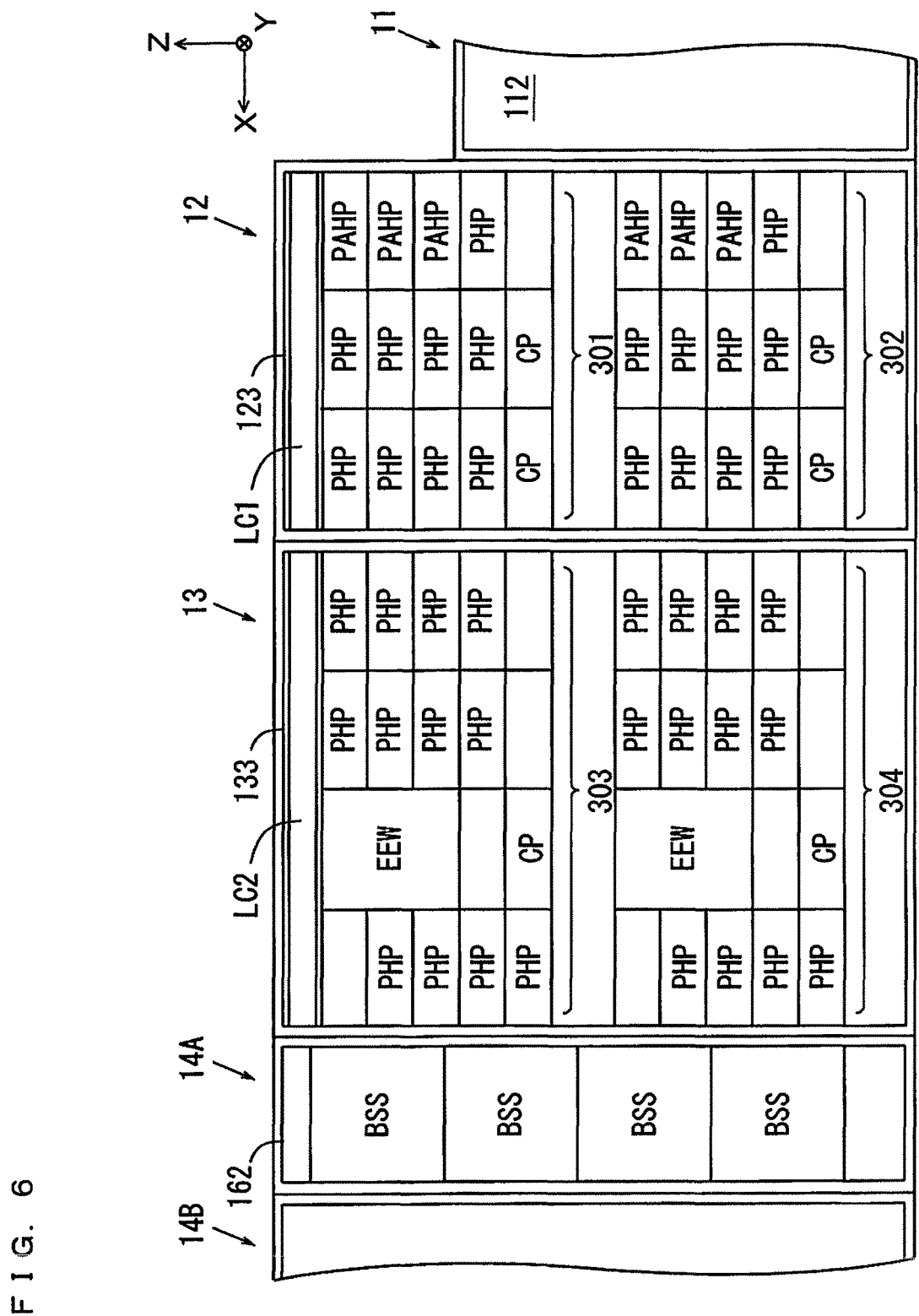
FIG. 6 is a schematic side view showing inner configurations of thermal processing sections and the cleaning drying processing section of FIG. 1.

FIG. 6 is a schematic side view showing inner configurations of the thermal processing sections 123, 133 and the cleaning drying processing section 162 of FIG. 1. As shown in FIG. 6, the thermal processing section 123 has an upper thermal processing section 301 provided above and a lower thermal processing section 302 provided below. In the upper thermal processing section 301 and the lower thermal processing section 302, a plurality of thermal processing units PHP, a plurality of adhesion reinforcement processing units PAHP and a plurality of cooling units CP are provided.

The local controller LC1 is provided at the top of the thermal processing section 123. The local controller LC1 controls operations of the coating processing section 121, the transport section 122 and the thermal processing section 123 based on instructions from the main controller 114 of FIG. 1.

In each thermal processing unit PHP, heating processing and cooling processing for the substrate W are performed. In each adhesion reinforcement processing unit PAHP, adhesion reinforcement processing for improving adhesion between the substrate W and an anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In the cooling unit CP, the cooling processing for the substrate W is performed.

The thermal processing section 133 has an upper thermal processing section 303 provided above and a lower thermal processing section 304 provided below. In each of the upper thermal processing section 303 and the lower thermal processing section 304, a cooling unit CP, a plurality of thermal processing units PHP and an edge exposure unit EEW are provided.

A local controller LC2 is provided at the top of the thermal processing section 133. The local controller LC2 controls operations of the development processing section 131, the transport section 132 and the thermal processing section 133 based on instructions from the main controller 114 of FIG. 1.

In the edge exposure unit EEW, exposure processing (edge exposure processing) for the peripheral portion of the substrate W is performed. The edge exposure processing is performed on the substrate W, so that a resist film on the peripheral portion of the substrate W is removed during the subsequent development processing. Thus, in the case where the peripheral portion of the substrate W comes into contact with another member after the development processing, the resist film on the peripheral portion of the substrate W is prevented from being stripped and becoming particles.

A plurality (four in the present example) of cleaning drying processing units BSS are provided in the cleaning drying processing section 162. In each cleaning drying processing unit BSS, the peripheral portion and the back surface of the substrate W on which the exposure processing has not been performed are cleaned with use of an organic solvent or pure water and dried. The cleaning drying processing units BSS provided in the cleaning drying processing section 162 have the configuration and functions similar to the configuration and functions of the cleaning drying processing units BSS provided in the cleaning drying processing section 161 of FIG. 2.

(5) Transport Sections

Figure 7:
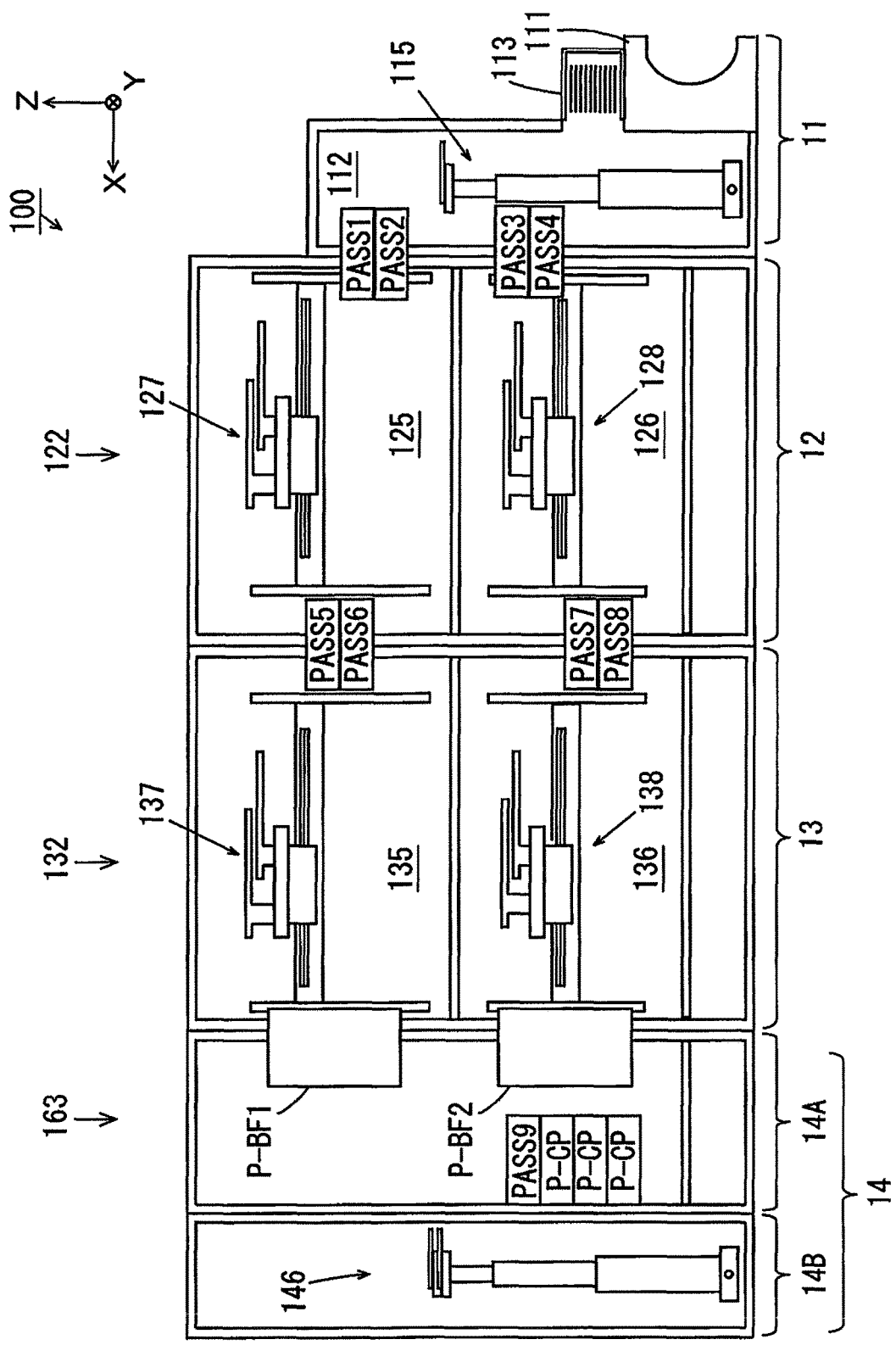
FIG. 7 is a schematic side view showing inner configurations of transport sections.

FIG. 7 is a schematic side view showing inner configurations of the transport sections 122, 132, 163. As shown in FIG. 7, the transport section 122 has an upper transport chamber 125 and a lower transport chamber 126. The transport section 132 has an upper transport chamber 135 and a lower transport chamber 136. A transport mechanism 127 is provided in the upper transport chamber 125, and a transport mechanism 128 is provided in the lower transport chamber 126. Further, a transport mechanism 137 is provided in the upper transport chamber 135, and a transport mechanism 138 is provided in the lower transport chamber 136.

The upper thermal processing section 301 (FIG. 6) is opposite to the coating processing chambers 21, 22 (FIG. 2) with the upper transport chamber 125 interposed therebetween. The lower thermal processing section 302 (FIG. 6) is opposite to the coating processing chambers 23, 24 (FIG. 2) with the lower transport chamber 126 interposed therebetween. The upper thermal processing section 303 (FIG. 6) is opposite to the development processing chambers 31, 32 (FIG. 2) with the upper transport chamber 135 interposed therebetween. The lower thermal processing section 304 (FIG. 6) is opposite to the development processing chambers 33, 34 (FIG. 2) with the lower transport chamber 136 interposed therebetween.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling units P-CP are provided in the transport section 163 to be adjacent to the carry-in carry-out block 14B.

The placement buffer unit P-BF1 is configured such that the substrate W can be carried into and carried out from the placement buffer unit P-BF1 by the transport mechanism 137 and the transport mechanisms 141, 142 (FIG. 1). The placement buffer unit P-BF2 is configured such that the substrate W can be carried into and carried out from the placement buffer unit P-BF2 by the transport mechanism 138 and the transport mechanisms 141, 142 (FIG. 1). Further, the substrate platform PASS9 and the placement cooling units P-CP are configured such that the substrates W can be carried into and carried out from the substrate platform PASS9 and the placement cooling units P-CP by the transport mechanisms 141, 142 (FIG. 1) and the transport mechanism 146.

The substrates W transported from the indexer block 11 to the first processing block 12 are placed on the substrate platform PASS1 and the substrate platform PASS3. The substrates W transported from the first processing block 12 to the indexer block 11 are placed on the substrate platform PASS2 and the substrate platform PASS4.

The substrates W transported from the first processing block 12 to the second processing block 13 are placed on the substrate platform PASS5 and the substrate platform PASS7. The substrates W transported from the second processing block 13 to the first processing block 12 are placed on the substrate platform PASS6 and the substrate platform PASS8.

The substrates W transported from the second processing block 13 to the cleaning drying processing block 14A are placed on the placement buffer units P-BF1, P-BF2. The substrates W transported from the cleaning drying processing block 14A to the carry-in carry-out block 14B are placed on the placement cooling units P-CP. The substrate W transported from the carry-in carry-out block 14B to the cleaning drying processing block 14A are placed on the substrate platform PASS9.

The transport mechanism 127 receives the substrate W from and transfer the substrate W to the coating processing chambers 21, 22 (FIG. 2), the substrate platforms PASS1, PASS2, PASS5, PASS6 (FIG. 7) and the upper thermal processing section 301 (FIG. 6). The transport mechanism 128 receives the substrate W from and transfer the substrate W to the coating processing chambers 23, 24 (FIG. 2), the substrate platforms PASS3, PASS4, PASS7, PASS8 (FIG. 7) and the lower thermal processing section 302 (FIG. 6).

The transport mechanism 137 receives the substrate W from and transfer the substrate W to the development processing chambers 31, 32 (FIG. 2), the substrate platforms PASS5, PASS6 (FIG. 7), the placement buffer unit P-BF1 (FIG. 7) and the upper thermal processing section 303 (FIG. 6). The transport mechanism 138 receives the substrate W from and transfer the substrate W to the development processing chambers 33, 34 (FIG. 2), the substrate platforms PASS7, PASS8 (FIG. 7), the placement buffer unit P-BF2 (FIG. 7) and the lower thermal processing section 304 (FIG. 6).

(6) Substrate Processing

The substrate processing will be described with reference to FIGS. 1, 2, 6 and 7. Each carrier 113 in which unprocessed substrates W are stored is placed on each carrier platform 111 (FIG. 1) in the indexer block 11. The transport mechanism 115 transports the unprocessed substrate W from the carrier 113 to each of the substrate platforms PASS1, PASS3 (FIG. 7). Further, the transport mechanism 115 transports the processed substrate W that is placed on each of the substrate platforms PASS2, PASS4 (FIG. 7) to the carrier 113.

In the first processing block 12, the transport mechanism 127 (FIG. 7) sequentially transports the unprocessed substrate W placed on the substrate platform PASS1 to the adhesion reinforcement processing unit PAHP (FIG. 6), the cooling unit CP (FIG. 6) and the coating processing chamber 22 (FIG. 2). Next, the transport mechanism 127 sequentially transports the substrate W in the coating processing chamber 22 to the thermal processing unit PHP (FIG. 6), the cooling unit CP (FIG. 6), the coating processing chamber 21 (FIG. 2), the thermal processing unit PHP (FIG. 6) and the substrate platform PASS5 (FIG. 7).

In this case, the adhesion reinforcement processing is performed on the substrate W in the adhesion reinforcement processing unit PAHP, and then the substrate W is cooled in the cooling unit CP to a temperature suitable for the formation of the anti-reflection film. Next, an anti-reflection film is formed on the substrate W by the coating processing unit 129 (FIG. 2) in the coating processing chamber 22. Subsequently, the thermal processing for the substrate W is performed in the thermal processing unit PHP, and then the substrate W is cooled in the cooling unit CP to a temperature suitable for the formation of the resist film. Then, a resist film is formed on the substrate W by the coating processing unit 129 (FIG. 2) in the coating processing chamber 21. Thereafter, the thermal processing for the substrate W is performed in the thermal processing unit PHP, and the substrate W is placed on the substrate platform PASS5.

Further, the transport mechanism 127 transports the substrate W on which the development processing has been performed and which is placed on the substrate platform PASS6 (FIG. 7) to the substrate platform PASS2 (FIG. 7).

The transport mechanism 128 (FIG. 7) sequentially transports the unprocessed substrate W placed on the substrate platform PASS3 to the adhesion reinforcement processing unit PAHP (FIG. 6), the cooling unit CP (FIG. 6) and the coating processing chamber 24 (FIG. 2). Next, the transport mechanism 128 sequentially transports the substrate W in the coating processing chamber 24 to the thermal processing unit PHP (FIG. 6), the cooling unit CP (FIG. 6), the coating processing chamber 23 (FIG. 2), the thermal processing unit PHP (FIG. 6) and the substrate platform PASS7 (FIG. 7).

Further, the transport mechanism 128 (FIG. 7) transports the substrate W on which the development processing has been performed and which is placed on the substrate platform PASS8 (FIG. 7) to the substrate platform PASS4 (FIG. 7). The contents of processing for the substrate W in the coating processing chambers 23, 24 (FIG. 2) and the lower thermal processing section 302 (FIG. 6) are respectively similar to the contents of processing for the substrate W in the above-mentioned coating processing chambers 21, 22 (FIG. 2) and the upper thermal processing section 301 (FIG. 6).

In the second processing block 13, the transport mechanism 137 (FIG. 7) sequentially transports the substrate W on which a resist film has been formed and which is placed on the substrate platform PASS5 to the edge exposure unit EEW (FIG. 6) and the placement buffer unit P-BF1 (FIG. 7). In this case, the edge exposure processing is performed on the substrate W in the edge exposure unit EEW. The substrate W on which the edge exposure processing has been performed is placed on the placement buffer unit P-BF1.

Further, the transport mechanism 137 (FIG. 7) takes out the substrate W on which the exposure processing and the thermal processing have been performed from the thermal processing unit PHP (FIG. 6) adjacent to the cleaning drying processing block 14A. The transport mechanism 137 sequentially transports the substrate W to the cooling unit CP (FIG. 6), one of the development processing chambers 31, 32 (FIG. 2), the thermal processing unit PHP (FIG. 6) and the substrate platform PASS6 (FIG. 7).

In this case, the substrate W is cooled in the cooling unit CP to a temperature suitable for the development processing, and then the development processing for the substrate W is performed by the development processing unit 139 in one of the development processing chambers 31, 32. Thereafter, the thermal processing for the substrate W is performed in the thermal processing unit PHP, and the substrate W is placed on the substrate platform PASS6.

The transport mechanism 138 (FIG. 7) sequentially transports the substrate W on which a resist film has been formed and which is placed on the substrate platform PASS7 to the edge exposure unit EEW (FIG. 6) and the placement buffer unit P-BF2 (FIG. 7).

Further, the transport mechanism 138 (FIG. 7) takes out the substrate W on which the exposure processing and the thermal processing have been performed from a thermal processing unit PHP (FIG. 6) adjacent to the interface block 14. The transport mechanism 138 sequentially transports the substrate W to a cooling unit CP (FIG. 6), one of the development processing chambers 33, 34 (FIG. 2), the thermal processing unit PHP (FIG. 6) and the substrate platform PASS8 (FIG. 7). The contents of processing for the substrate W in the development processing chambers 33, 34, and the lower thermal processing section 304 are respectively similar to the contents of processing for the substrate W in the above-mentioned development processing chambers 31, 32 and the upper thermal processing section 303.

In the cleaning drying processing block 14A, the transport mechanism 141 (FIG. 1) sequentially transports the substrate W placed on the placement buffer units P-BF1, P-BF2 (FIG. 7) to one of the cleaning drying processing units BSS (FIG. 2 or 6) in the cleaning drying processing sections 161, 162 and a placement cooling unit P-CP (FIG. 7).

In this case, in any one of the cleaning drying processing units BSS, the peripheral portion and the back surface of the substrate W are cleaned and dried. Thereafter, the substrate W is cooled in the placement cooling unit P-CP to a temperature suitable for the exposure processing by the exposure device 15 (FIG. 1).

The transport mechanism 142 (FIG. 1) sequentially transports the substrate W on which the exposure processing has been performed and which is placed on the substrate platform PASS9 (FIG. 7) to a thermal processing unit PHP (FIG. 6) in the upper thermal processing section 303 or the lower thermal processing section 304. In this case, post-exposure bake (PEB) processing is performed in the thermal processing unit PHP.

In the carry-in carry-out block 14B, the transport mechanism 146 (FIG. 1) transports the substrate W on which the exposure processing has not been performed and which is placed on the placement cooling unit P-CP (FIG. 7) to a substrate inlet of the exposure device 15 (FIG. 1). Further, the transport mechanism 146 takes out the substrate W on which the exposure processing has been performed from a substrate outlet of the exposure device 15, and transports the substrate W to the substrate platform PASS9 (FIG. 7).

In the present embodiment, the processing for the substrates W in the coating processing chambers 21, 22, the development processing chambers 31, 32 and the upper thermal processing sections 301, 303 provided above, and the processing for the substrates W in the coating processing chambers 23, 24, the development processing chambers 33, 34 and the lower thermal processing sections 302, 304 provided below can be concurrently performed. Thus, it is possible to improve throughput without increasing a footprint.

(7) Effects

In the substrate processing apparatus 100 according to the present embodiment, the used metal removal liquid and the used organic removal liquid that have been supplied to the substrate W from the edge rinse nozzles 41, 43 and the back rinse nozzles 42, 44 are stored in the collection tank 53. The specific gravity of the organic removal liquid is smaller than the specific gravity of the metal removal liquid, so that the layer of the metal removal liquid and the layer of the organic removal liquid are formed to be separated into the upper and lower layers in the collection tank 53. Thus, the metal removal liquid and the organic removal liquid are separated by the processing liquid separating mechanism 50A based on the specific gravity.

In this configuration, even in the case where being discharged through the common collection pipe 50, the used metal removal liquid and the used organic removal liquid can be separated in the collection tank 53. As a result, the metal removal liquid and the organic removal liquid can be separately collected. Further, the metal removal liquid and the organic removal liquid are separately collected, whereby the cost of discarding the removal liquid can be reduced.

(8) Other Embodiments (a) While the processing liquid separating mechanism 50A is not provided in the development processing chambers 31 to 34 in the above-mentioned embodiment, the present invention is not limited to this. In the case where different types of development liquids are used for mixed processing of the positive-tone development processing and the negative-tone development processing performed on the substrate W in each of the development processing chambers 31 to 34, the processing liquid separating mechanism 50A may be provided in each of the development processing chambers 31 to 34.

For example, in each of the development processing chambers 31 to 34, an alkaline aqueous solution, for example, Tetra Methyl Ammonium Hydroxide (TMAH), Potassium Hydroxide (KOH) or the like, can be used as a development liquid for the positive-tone development processing. Further, in each of the development processing chambers 31 to 34, a development liquid including an organic solvent such as Butyl Acetate can be used as a development liquid for the negative-tone development processing. In this case, the processing liquid separating mechanism 50A is provided in each of the development processing chambers 31 to 34, whereby the used development liquid for the positive-tone development processing and the used development liquid for the negative-tone development processing can be separately collected.

In this configuration, when a substrate W, having a resist film on which the positive-tone development processing is to be performed and which is formed on a surface to be processed, is held by the spin chuck 35, the development liquid for the positive-tone development processing is discharged from the slit nozzle 38. Thus, the resist film of the substrate W can be developed into a positive-tone resist film. On the other hand, when a substrate W, having a resist film on which the negative-tone development processing is to be performed and which is formed on a surface to be processed, is held by the spin chuck 35, the development liquid for the negative-tone development processing is discharged from the slit nozzle 38. Thus, the resist film on the substrate W can be developed into a negative-tone resist film.

(b) While a metal component is contained in both of the anti-reflection liquid and the resist liquid in the above-mentioned embodiment, the present invention is not limited to this. The metal component does not have to be contained in one of the anti-reflection liquid and the resist liquid. In this case, the edge rinse nozzle 43 and the back rinse nozzle 44 are not provided in the coating processing chambers 21, 23, or the edge rinse nozzle 43 and the back rinse nozzle 44 are not provided in the coating processing chambers 22, 24.

(c) While a metal component is contained in the anti-reflection liquid and the resist liquid used as the coating liquids in the above-mentioned embodiment, the present invention is not limited to this. For example, a metal component may be contained in a coating liquid for forming a hard mask (HM). In this case, titan oxide ($TiO_x$), tungsten oxide ($WO_x$) or zirconium oxide ($ZrO_x$), for example, is contained in a coating liquid as a metal component.

(d) While the two cleaning drying processing sections 161, 162 are provided in the cleaning drying processing block 14A in the above-mentioned embodiment, the present invention is not limited to this. One of the cleaning drying processing section 161 and the cleaning drying processing section 162 may be provided in the cleaning drying processing block 14A, and the other one of the cleaning drying processing section 161 and the cleaning drying processing section 162 does not have to be provided in the cleaning drying processing block 14A.

(e) While the edge rinse nozzle 41 and the back rinse nozzle 42 are provided in the coating processing unit 129 in the above-mentioned embodiment, the present invention is not limited to this. One or both of the edge rinse nozzle 41 and the back rinse nozzle 42 do not have to be provided in the coating processing unit 129.

(f) While the edge rinse nozzle 41 for discharging the organic removal liquid and the edge rinse nozzle 43 for discharging the metal removal liquid are separately provided in the coating processing unit 129 in the above-mentioned embodiment, the present invention is not limited to this. A common edge rinse nozzle for selectively discharging the organic removal liquid and the metal removal liquid may be provided in the coating processing unit 129.

Similarly, the back rinse nozzle 42 for discharging the organic removal liquid and the back rinse nozzle 44 for discharging the metal removal liquid are separately provided in the coating processing unit 129. However, the present invention is not limited to this. A common back rinse nozzle for selectively discharging the organic removal liquid and the metal removal liquid may be provided in the coating processing unit 129.

(g) While the coating processing unit 129 includes the collection pipe 50 and the collection tank 53 in the above-mentioned embodiment, the present invention is not limited to this. In the case where the cup 27 is used as a storage for storing the used processing liquid, the coating processing unit 129 does not have to include the collection pipe 50 and the collection tank 53. In this case, the boundary detector 54 and the collection pipes 55, 56 of the processing liquid separating mechanism 50A are provided in the cup 27.

(h) In the above-mentioned embodiment, the processing liquid (the metal removal liquid or the development liquid for positive-tone development processing) containing an aqueous solution is used as the first processing liquid, and the processing liquid (the organic removal liquid or the development liquid for negative-tone development processing) containing an organic solvent is used as the second processing liquid. However, the present invention is not limited to this. As long as the specific gravity of the second processing liquid is smaller than the specific gravity of the first processing liquid, the first and second processing liquids may be other processing liquids different from the above-mentioned processing liquids.

(9) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the spin chuck 25 or the spin chuck 35 is an example of a substrate holder, and the edge rinse nozzles 41, 43 or the slit nozzle 38 are examples of a processing liquid supply unit. The collection tank 53 is an example of a storage, the processing liquid separating mechanism 50A is an example of a processing liquid separating mechanism, the substrate processing apparatus 100 is an example of a substrate processing apparatus and the collection pipes 55, 56 are examples of first and second discharge pipes, respectively.

The collection valves 55v, 56v are examples of first and second discharge valves, respectively, the boundary detector 54 is an example of a boundary surface detector and the local controller LC1 is an example of a controller. The coating liquid nozzle 28 is an example of a coating liquid supply unit, and the back rinse nozzles 42, 44 are examples of a back surface processing unit.

As each of constituent elements recited in the claims, various other elements having configurations or functions described in the claims can be also used.

INDUSTRIAL APPLICABILITY

The present invention can be effectively utilized for processing for various types of substrates.

The invention claimed is:

1. A substrate processing apparatus comprising:
a substrate holder that holds a substrate;
a processing liquid supply unit that supplies a first processing liquid having first specific gravity and a second processing liquid having second specific gravity smaller than the first specific gravity to a surface to be processed of the substrate held by the substrate holder;
a storage that stores the used first and second processing liquids that have been supplied to the substrate; and
a processing liquid separating mechanism that separates the first processing liquid and the second processing liquid based on specific gravity, the first and second processing liquids being stored in the storage,
wherein the processing liquid separating mechanism includes
a first discharge pipe provided to discharge the used first processing liquid from the storage,
a second discharge pipe provided to discharge the used second processing liquid from the storage,
a first discharge valve inserted into the first discharge pipe,
a boundary surface detector that detects a boundary surface between the first processing liquid and the second processing liquid that are stored in the storage, and
a controller that acquires the boundary surface detected by the boundary surface detector, controls the first discharge valve such that, in the case where the acquired detection surface is equal to or lower than a predetermined lower limit position, the first discharge valve is closed, and controls the first discharge valve such that, in the case where the acquired detection surface is higher than the lower limit position, the first discharge valve is opened, and
the first discharge pipe is connected to the storage at a position lower than the lower limit position, and the second discharge pipe is connected to the storage at a position higher than the lower limit position.

2. The substrate processing apparatus according to claim 1, wherein
the processing liquid separating mechanism further includes a second discharge valve inserted into the second discharge pipe, and
the controller, in the case where the acquired detection surface is equal to or lower than an upper limit position, which has been determined in advance and is higher than the lower limit position, opens the second discharge valve, and in the case where the acquired detection surface is higher than the upper limit position, closes the second discharge valve.

3. The substrate processing apparatus according to claim 1, wherein
the first processing liquid includes an aqueous solution, and
the second processing liquid includes an organic solvent.

4. A substrate processing apparatus comprising:
a substrate holder that holds a substrate;
a processing liquid supply unit that supplies a first processing liquid having first specific gravity and a second processing liquid having second specific gravity smaller than the first specific gravity to a surface to be processed of the substrate held by the substrate holder;
a storage that stores the used first and second processing liquids that have been supplied to the substrate;
a processing liquid separating mechanism that separates the first processing liquid and the second processing liquid based on specific gravity, the first and second processing liquids being stored in the storage; and
a coating liquid supply unit configured to discharge a coating liquid containing metal as a metal containing coating liquid, wherein
the substrate holder is configured to hold and rotate the substrate in a horizontal attitude, the first processing liquid dissolves the metal in the metal containing coating liquid, the second processing liquid dissolves the coating liquid in the metal containing coating liquid, the coating liquid supply unit forms a metal containing coating film on the surface to be processed of the substrate by discharging the metal containing coating liquid to the surface to be processed of the substrate rotated by the substrate holder, and the processing liquid supply unit supplies the first and second processing liquids to a peripheral portion of the surface to be processed of the substrate rotated by the substrate holder such that the metal containing coating film remains in a region except for the peripheral portion of the surface to be processed of the substrate.

5. The substrate processing apparatus according to claim 4, further comprising a back surface processing unit that supplies the first and second processing liquids to a back surface, which is opposite to the surface to be processed, of the substrate rotated by the substrate holder.

6. A substrate processing apparatus comprising:

a substrate holder that holds a substrate;

a processing liquid supply unit that supplies a first processing liquid having first specific gravity and a second processing liquid having second specific gravity smaller than the first specific gravity to a surface to be processed of the substrate held by the substrate holder;

a storage that stores the used first and second processing liquids that have been supplied to the substrate; and a processing liquid separating mechanism that separates the first processing liquid and the second processing liquid based on specific gravity, the first and second processing liquids being stored in the storage, wherein the substrate holder selectively holds a substrate having a surface to be processed on which positive-tone development processing is to be performed, and a substrate having a surface to be processed on which negative-tone development processing is to be performed, the first processing liquid is a development liquid for positive-tone development, the second processing liquid is a development liquid for negative-tone development, and the processing liquid supply unit, when the substrate having the surface to be processed on which the positive-tone development processing is to be performed is held by the substrate holder, discharges the first processing liquid, and when the substrate having the surface to be processed on which the negative-tone development processing is to be performed is held by the substrate holder, discharges the second processing liquid.

7. A substrate processing method including:

holding a substrate by a substrate holder;

supplying a first processing liquid having first specific gravity and a second processing liquid having second specific gravity smaller than the first specific gravity by a processing liquid supply unit to a surface to be processed of the substrate held by the substrate holder;

storing the used first and second processing liquids that have been supplied to the substrate by the processing liquid supply unit in a storage; and separating the first processing liquid and the second processing liquid based on specific gravity, the first and second processing liquids being stored in the storage, wherein a first discharge pipe is connected to the storage at a position lower than a predetermined lower limit position to discharge the used first processing liquid from the storage, a second discharge pipe is connected to the storage at a position higher than the lower limit position to discharge the used second processing liquid from the storage, a discharge valve is inserted into the first discharge pipe, and the separating includes detecting a boundary surface between the first processing liquid and the second processing liquid that are stored in the storage by a boundary surface detector, and acquiring the boundary surface detected by the boundary surface detector, closing the discharge valve in the case where the acquired detection surface is equal to or lower than the lower limit position, and opening the discharge valve in the case where the acquired detection surface is higher than the lower limit position.

8. A substrate processing method including:

holding a substrate by a substrate holder;

discharging a coating liquid containing metal as a metal containing coating liquid by a coating liquid supply unit;

supplying a first processing liquid having first specific gravity and a second processing liquid having second specific gravity smaller than the first specific gravity by a processing liquid supply unit to a surface to be processed of the substrate held by the substrate holder;

storing the used first and second processing liquids that have been supplied to the substrate by the processing liquid supply unit into a storage; and separating the first processing liquid and the second processing liquid based on specific gravity, the first and second processing liquids being stored in the storage, wherein the holding the substrate includes holding and rotating the substrate in a horizontal attitude, the discharging the metal containing coating liquid includes forming a metal containing coating film on the surface to be processed of the substrate rotated by the substrate holder, and the supplying the first and second processing liquids to the surface to be processed of the substrate includes supplying the first processing liquid that dissolves the metal in the metal containing coating liquid and the second processing liquid that dissolves the coating liquid in the metal containing coating liquid to a peripheral portion of the surface to be processed of the substrate rotated by the substrate holder such that the metal containing coating film remains in a region except for the peripheral portion of the surface to be processed of the substrate.

9. A substrate processing method including:

holding a substrate by a substrate holder;

supplying a first processing liquid having first specific gravity and a second processing liquid having second specific gravity smaller than the first specific gravity by a processing liquid supply unit to a surface to be processed of the substrate held by the substrate holder;

storing the used first and second processing liquids that have been supplied to the substrate by the processing liquid supply unit into a storage; and separating the first processing liquid and the second processing liquid based on specific gravity, the first and second processing liquids being stored in the storage, wherein the substrate holder selectively holds a substrate having a surface to be processed on which positive-tone development processing is to be performed, and a substrate having a surface to be processed on which negative-tone development processing is to be performed, the first processing liquid is a development liquid for positive-tone development, the second processing liquid is a development liquid for negative-tone development, and the processing liquid supply unit, when the substrate having the surface to be processed on which the positive-tone development processing is to be performed is held by the substrate holder, discharges the first processing liquid, and when the substrate having the surface to be processed on which the negative-tone development processing is to be performed is held by the substrate holder, discharges the second processing liquid.

* * * * *